United States Patent
Balzli, Jr.

(10) Patent No.: US 8,719,750 B1
(45) Date of Patent: May 6, 2014

(54) PLACEMENT AND ROUTING OF A CIRCUIT DESIGN

(71) Applicant: Xilinx, Inc., San Jose, CA (US)

(72) Inventor: Robert M. Balzli, Jr., Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/674,889

(22) Filed: Nov. 12, 2012

(51) Int. Cl.
*G06F 17/50* (2006.01)

(52) U.S. Cl.
USPC ........... 716/113; 716/116; 716/118; 716/119; 716/126

(58) Field of Classification Search
USPC .......................... 716/113, 116, 118, 119, 126
See application file for complete search history.

(56) References Cited

U.S. PATENT DOCUMENTS

| | | | | |
|---|---|---|---|---|
| 7,251,804 | B1 * | 7/2007 | Trimberger | 716/112 |
| 7,640,527 | B1 * | 12/2009 | Dorairaj et al. | 716/139 |
| 8,018,249 | B2 * | 9/2011 | Koch et al. | 326/41 |
| 8,436,646 | B1 * | 5/2013 | Mendel et al. | 326/38 |

OTHER PUBLICATIONS

Bieser et al., "Rapid Prototyping Design Acceleration Using a Novel Merging Methodology for Partial Configuration Streams of Xilinx Virtex-II FPGAs", 2006, Proceedings of the 17th IEEE International Workshop on Rapid System Prototype, 7 pages.*
Hagemeyer et al.,"Design of Homogeneous Communication Infrastructures for Partially Reconfiguration FPGAs", Jun. 2007, Proceedings of IEEE International Conference on Engineering of Reconfiguration Systems and Algorithms, 10 pages.*
U.S. Appl. No. 13/588,435, filed Aug. 17, 2012, Tseng, Chen W. et al., Xilinx, Inc., San Jose, CA USA.
U.S. Appl. No. 13/588,647, filed Aug. 17, 2012, Lu, Weiguang et al., Xilinx, Inc., San Jose, CA USA.
Xilinx, Inc, "Fast Configuration of PCI Express Technology through Partial Reconfiguration", XAPP883, v.1.0, Nov. 19, 2010, pp. 1-45, San Jose, CA USA.

* cited by examiner

*Primary Examiner* — Sun Lin
(74) *Attorney, Agent, or Firm* — LeRoy D. Maunu

(57) ABSTRACT

Approaches for placing and routing a circuit design on a programmable integrated circuit (IC) are disclosed. One partial reconfiguration (PR) resource portion of the circuit design is selected from a plurality of PR resource portions of the design. Uncontained resources in the PR resource portion is identified. The PR resource portion, less the uncontained resources, is placed in an assigned region, and the uncontained resources is placed on the programmable IC unconstrained by the assigned region of the PR resource portion. The design is routed from the placed PR resource portion to the placed uncontained resources, and the process is repeated for each unplaced PR resource portion. After placing the plurality of PR resource portions and routing to uncontained resources in the plurality of PR resource portions, unplaced portions of the circuit design are placed and routed.

20 Claims, 8 Drawing Sheets

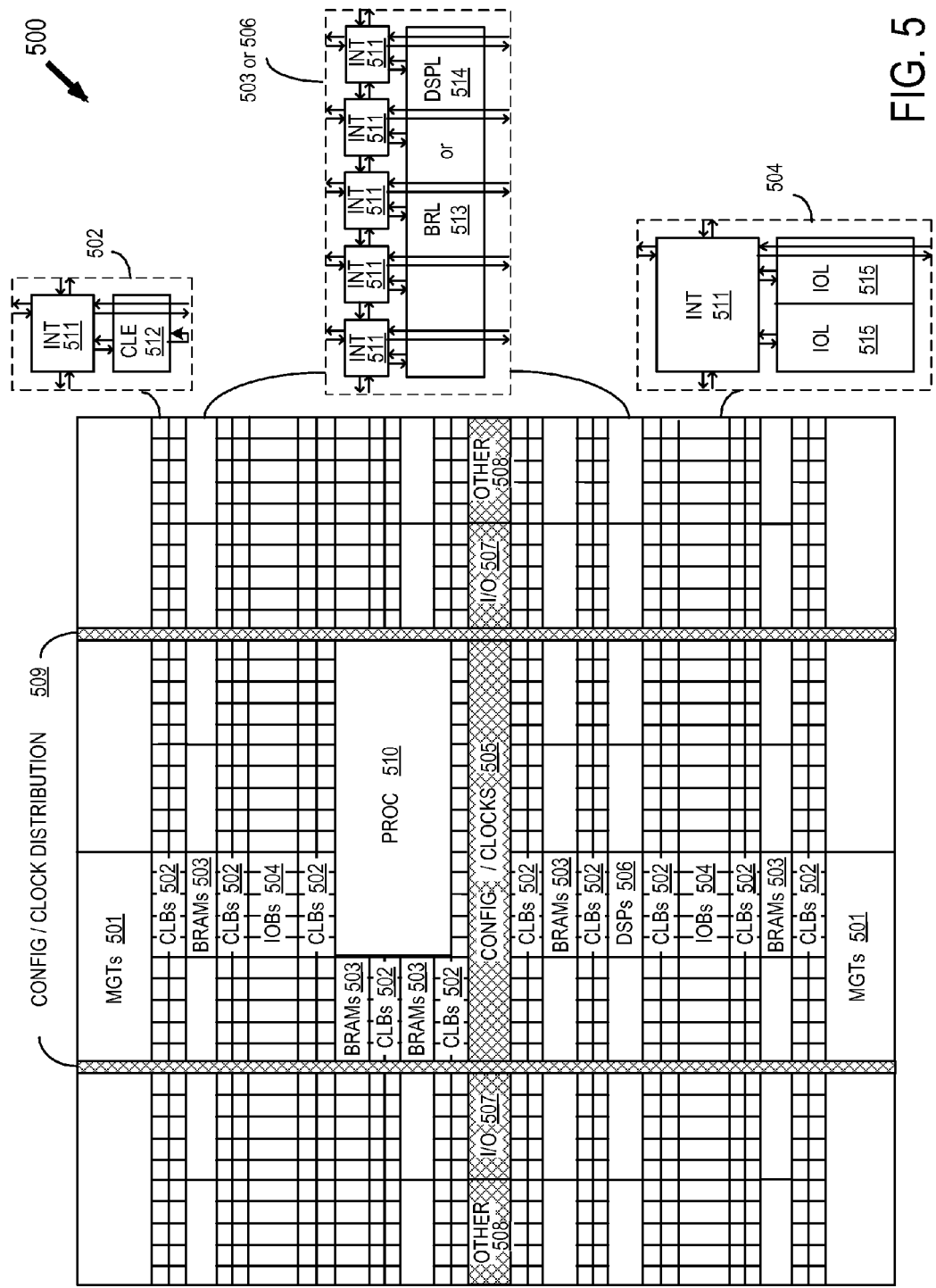

PLACEMENT AND ROUTING OF A CIRCUIT DESIGN

FIELD OF THE INVENTION

An embodiment generally relates to the placement and routing of circuit designs.

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

In some programmable ICs, configuration memory cells are organized by frames for addressing configuration memory cells for purposes of programming and reading back the states of the configuration memory cells. A frame is the smallest quantity of configuration memory cells that can be programmed, and the configuration memory cells of a frame control many tiles of an FPGA. That is, in order to program certain configuration memory cells of a frame, all the configuration memory cells in the frame need to be programmed, which affects all the tiles covered by the frame.

A partially configurable portion of a circuit design refers to one or more modules for which a configuration bitstream can be generated and used to partially configure the FPGA. The remaining modules of the design are not required for the partially configurable portion of the design to be initially implemented on the FPGA. A partially reconfigurable portion of the design refers to one or more modules that have different implementations in separate configuration bitstreams. For a partially reconfigurable portion of the design, the FPGA is configured with a first bitstream to implement a first version of the partial reconfiguration (PR) modules. Subsequently, the FPGA is partially reconfigured to implement a second version of the PR modules. A static portion of the circuit design refers to one or more modules that are not subject to partial reconfiguration once implemented on the FPGA. A partially configurable portion may be static if it is not subject to partial reconfiguration.

A conventional design process begins with the creation of the design. The design specifies the function of a circuit at a schematic or logic level and may be represented using various hardware description languages (e.g., VHDL, ABEL, or Verilog) or schematic capture programs. The design is synthesized to produce a logical network list ("netlist"), and the synthesized design is mapped onto primitive components within the target device (e.g., programmable logic blocks of an FPGA).

Following mapping, placement of the components of the synthesized and mapped design is performed for the target device. During placement, each mapped component of the design is assigned to a physical position on the device. The placer attempts to place connected design objects in close physical proximity to one another in order to conserve space and increase the probability that the required interconnections between components will be successfully completed by the router. Placing connected components close to one another also generally improves the performance of the circuit since long interconnect paths are associated with excess capacitance and resistance, resulting in longer delays and greater power consumption.

Specified connections between components of the design are routed within the target device for the placed components. The routing process specifies physical wiring resources that will be used to conduct signals between pins of placed components of the design. For each connection specified in the design, the routing process allocates wire resources necessary to complete the connection. As used herein, the selection and assignment of wire resources in connecting the output pin of one component to the input pin of another component is referred to as routing a net.

SUMMARY

In one embodiment, a method is provided for placing and routing a circuit design on a programmable integrated circuit (IC). The method includes selecting one partial reconfiguration (PR) resource portion of the circuit design from a plurality of PR resource portions of the design. Each PR resource portion is assigned to a respective region of the programmable IC. Uncontained resources in the PR resource portion is identified. The PR resource portion, less the uncontained resources, is placed in the respective region, and the uncontained resources are placed on the programmable IC unconstrained by the respective region. The placed PR resource portion is routed to the placed uncontained resources. The process is repeated for each unplaced PR resource portion. After placing the plurality of PR resource portions and routing to uncontained resources in the plurality of PR resource portions, unplaced portions of the circuit design are placed and routed.

In another embodiment, a system is provided for placing and routing a circuit design on a programmable integrated circuit (IC). The system includes a processor and a memory arrangement coupled to the processor. The memory arrangement is configured with instructions that are executable by the processor for causing the processor to perform the operations of selecting one partial reconfiguration (PR) resource portion of the circuit design from a plurality of PR resource portions of the design. Each PR resource portion is assigned to a respective region of the programmable IC. Uncontained resources in the PR resource portion is identified. The PR resource portion, less the uncontained resources, is placed in the respective region, and the uncontained resources are placed on the programmable IC unconstrained by the respective region. The placed PR resource portion is routed to the placed uncontained resources. The operations are repeated for each unplaced PR resource portion. After placing the plurality of PR resource portions and routing to uncontained resources in the plurality of PR resource portions, unplaced portions of the circuit design are placed and routed.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which:

FIGS. 3-1 and 3-2 show a flowchart of an example process for placing and routing a circuit design in which the design is partitioned into partitions having PR logic and uncontained logic;

FIG. 4-1 shows the example of FIG. 2 in which the placed and routed at-large logic fails to satisfy a timing constraint;

FIG. 4-2 shows the modifications made to the placement and routing of FIG. 4-1 by the process of FIG. 3-2;

FIG. 5 is a block diagram of an example programmable integrated circuit (IC) on which a circuit design may be placed and routed.

DETAILED DESCRIPTION OF THE DRAWINGS

Figure 1:
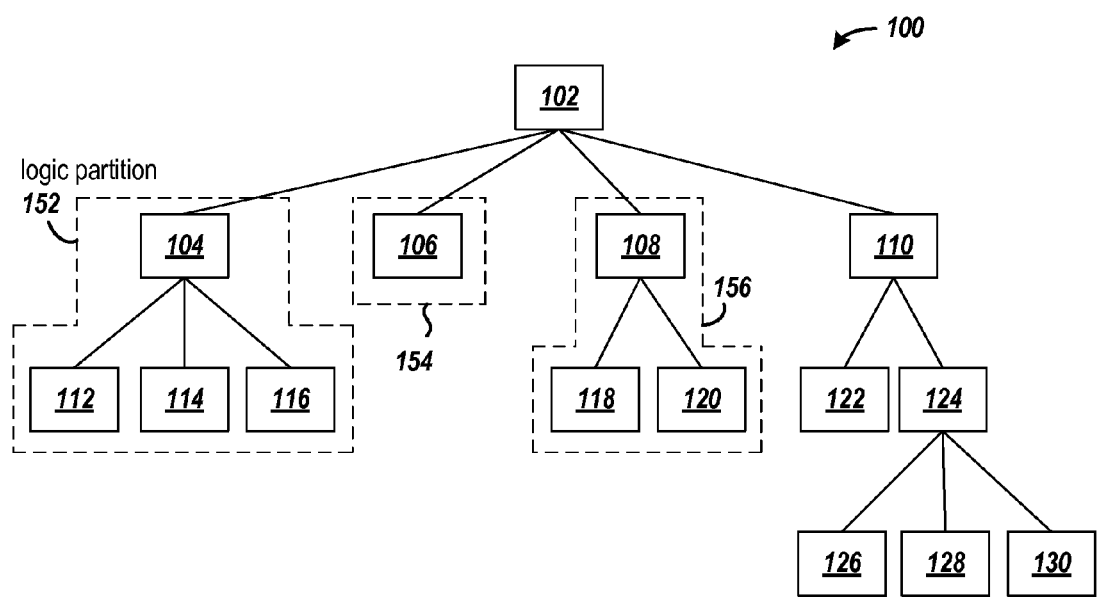
FIG. 1 shows an example of hierarchical logic of a circuit design.

For a design having partial reconfiguration logic and uncontained logic in the same level of a logic hierarchy, prior hierarchical design flows required designers to move the uncontained logic to a top level of the hierarchy. This was typically because the target device could not support both partial reconfiguration logic and uncontained logic in a particular programmable portion (e.g., a frame) of the device. For example, some XILINX FPGAs have resources such as input/output blocks (IOBs), gigabit transceivers (GTs), phase locked loops (PLLs), mixed mode clock managers (MMCMs), phasers, and center control logic. If the designer's register transfer level (RTL) description had a reconfigurable portion that used any of these resources, which need not be contained in the region assigned to the reconfigurable portion, the logic elements (uncontained logic) requiring these resources had to be moved to the top-level of the design hierarchy. This requirement was cumbersome because moving these elements to the top level of the hierarchy would create large nets to connect from the bottom level of the hierarchy to the top level through the RTL. In addition, the designer would be required to create a wrapper for interfacing between the top-level uncontained element and the lower level reconfigurable logic.

With the partial configuration and partial reconfiguration approaches and circuits disclosed in U.S. patent application Ser. No. 13/588,647, which was filed on Aug. 17, 2012, partial configuration/reconfiguration and uncontained portions of a design can be programmed by the same frame. The entire contents of U.S. patent application Ser. No. 13/588,647 are incorporated herein by reference. The approaches and circuits of the referenced patent application remove the restriction of having to separate uncontained and partial configuration/reconfiguration portions of the design into resources controlled by different frames. This in turn supports new approaches for placing and routing a circuit design having partial configuration/reconfiguration and uncontained portions.

Though the various approaches and implementations are described with reference to partial reconfiguration logic portions of a design, the methods and systems described herein are also applicable to a design having partial configuration logic portions. Thus, where partial reconfiguration logic portion is used herein, it is intended to refer to both partial reconfiguration logic portions and partial configuration logic portions.

In one approach, the method of placing and routing a circuit design on a programmable integrated circuit (IC) includes selecting a partial reconfiguration (PR) logic portion of the circuit design from a plurality of PR logic portions of the design. Each PR logic portion is assigned to a respective region of the programmable IC. Uncontained logic in the PR logic portion is identified. The resources of the programmable IC on which the uncontained logic is placed need not be in the respective region of the PR logic portion. The PR logic portion, less the uncontained logic, is placed in the respective region, and the uncontained logic is placed on a resource on the programmable IC unconstrained by the respective region. The PR logic portion placed in the respective region is then routed to the placed uncontained logic. The process is repeated for each unplaced PR logic portion. After placing the PR logic portions and routing to the uncontained logic, the unplaced portions of the circuit design are placed and routed with those tiles having routing resources used by the routing of the uncontained logic prohibited from being used.

Uncontained logic may be identified as being static in which case the uncontained logic and routing would not change after the initial programming. The partial bit stream will mask out these tiles from being reprogrammed. The static identification prevents uncontained logic or any PR logic within the contained PR region, which has analog behaviors, from being reset or from losing its logical state. This feature, which allows static logic within a partial bit stream, may be suitable for many use cases. This may be used for partial reconfiguration or partial configuration of a super logic region of an FPGA, for example, or for programming a partial bit stream with static logic in it over a PCIE or ETHERNET link.

FIG. 1 shows an example of hierarchical logic of a circuit design 100. Each block represents a portion of the logic of the circuit design. The example circuit design includes root-level logic 102, which contains top-level resource portions such as, e.g., top-level logic portions 104, 106, 108, and 110. Logic portion 104 includes logic portions 112, 114, and 116, and logic portion 108 includes logic portions 118 and 120. Logic portion 106 does not include any lower-level logic portions. Logic portion 110 includes logic portions 122 and 124, and logic portion 124 further includes logic portions 126, 128, and 130.

Circuit interfaces may be defined (not shown) for blocks having the same parent block. For example, circuit interfaces may be defined between two or more of blocks 104, 106, 108, and 110 according to the particulars of the circuit design. The leaf blocks, such as blocks 112, 114, and 116, may define the logic functions to be implemented as a circuit.

In the example design 100, three resource partitions such as, e.g., three logic partitions 152, 154, and 156 are designated for partial reconfiguration (PR). The logic of logic portion 110 is static logic. Logic partition 152 includes PR logic portion 104, which includes logic portions 112, 114, and 116. Logic portion 112 is uncontained logic within the PR logic partition 152. The PR logic portions 104, 114, and 116 are to be placed on programmable logic resources within the boundaries of an assigned (designer specified) PR region of a target device. The uncontained logic requires a resource of the programmable IC that may or may not reside within the boundaries assigned to logic partition 152. Examples of resources required by the uncontained logic include IOBs, GTs, PLLs, MMCMs, phasers, and center control logic. PR logic partition 156 similarly includes logic portions 108 and 120, which are to be placed in the region assigned to partition 156, and uncontained logic portion 118, which requires a resource that may or may not reside within the boundaries assigned to partition 156.

Figure 2:
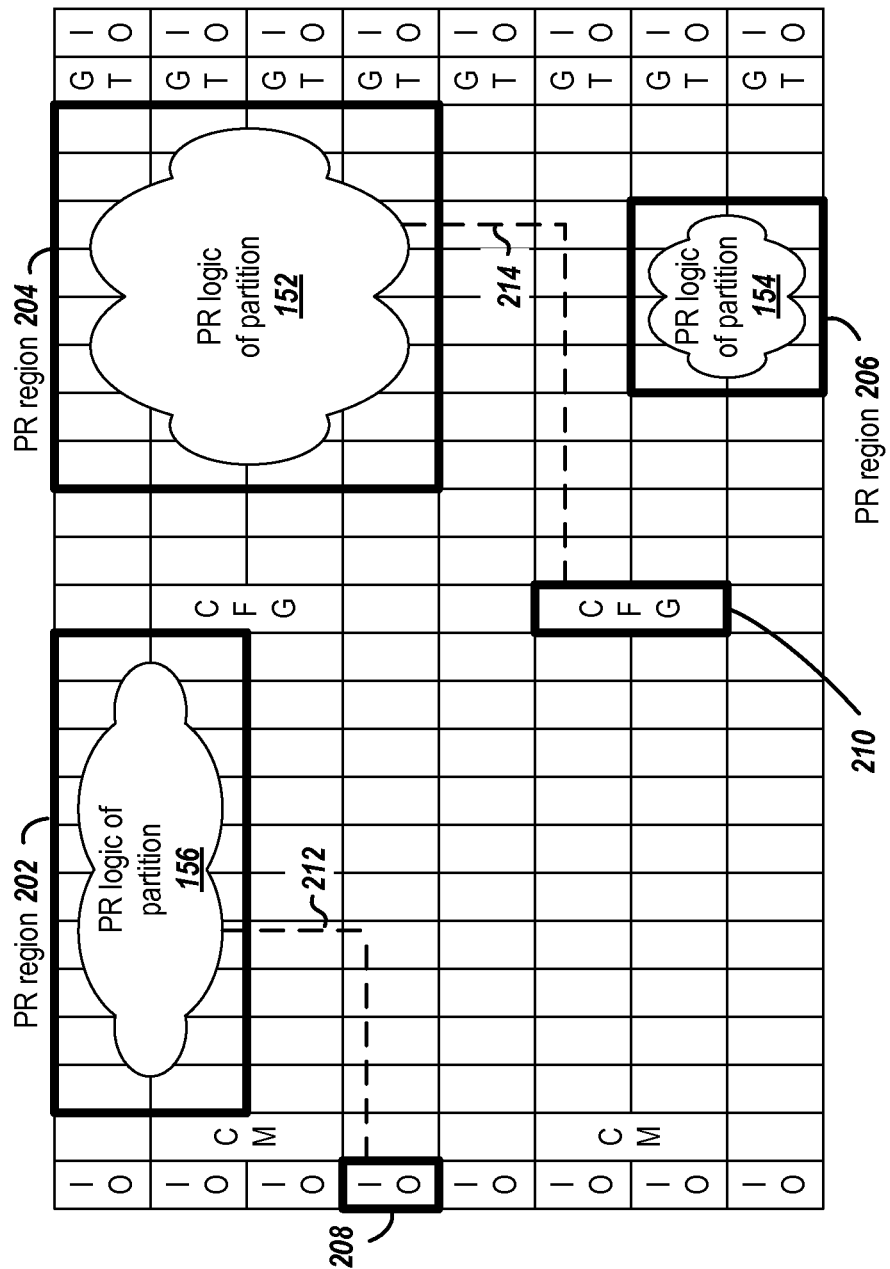
FIG. 2 shows a circuit block diagram of an example programmable IC with logic of a circuit design placed and routed.

The logic of FIG. 1 is shown as having been placed and routed in the circuit block diagram of FIG. 2.

FIG. 2 shows a circuit block diagram of an example programmable IC with logic of circuit design 100 placed and routed. The resources and layout of the resources of the programmable IC are for purposes of illustrating placement of PR logic portions and uncontained logic portions of a design. Thus, the numbers and types of resources illustrated may vary from an actual programmable IC.

The example programmable IC includes an array of programmable resources. The programmable resources include configurable logic, configurable routing, IOBs, clock manager (CM) logic, configuration logic (CFG), and GTs. Though not shown, the programmable resources may further include digital signal processors (DSPs) and block RAM (BRAMs). The blocks labeled IO correspond to the IOBs, and the blocks labeled CM, CFG, and GT correspond to CMs, configuration logic, and GTs, respectively. The blank blocks may be understood to have programmable logic and routing resources.

PR logic portions of partitions 152, 154, and 156 are placed in assigned PR regions 202, 204, and 206 of the device, respectively. Since the logic portion 110 may be placed and routed throughout the programmable IC, it is not illustrated in FIG. 2. Static logic portion 110 is placed and routed on various resources other than those in PR regions 202, 204, and 206, IOB 208, CFG 210, and one or more of the resources along the route 212 from region 202 to IOB 208 and the route 214 from region 204 to CFG 210. Logic such as static logic 110 may be referred to as at-large static logic in this disclosure. Logic 110 may also be referred to as top-level logic.

Uncontained logic of the PR logic partitions is placed outside the PR regions in the example. The uncontained logic 112 of PR logic partition 152, which is CFG logic, is placed on configuration resource 210, and the uncontained logic 118 of PR logic partition 156, which is IOB logic, is placed on IOB resource 208. The IOB is outside the PR region 202 to which the PR logic partition 156 is assigned, and the CFG is outside the PR region 204 to which the PR logic partition 152 is assigned.

Figures 1, 3:
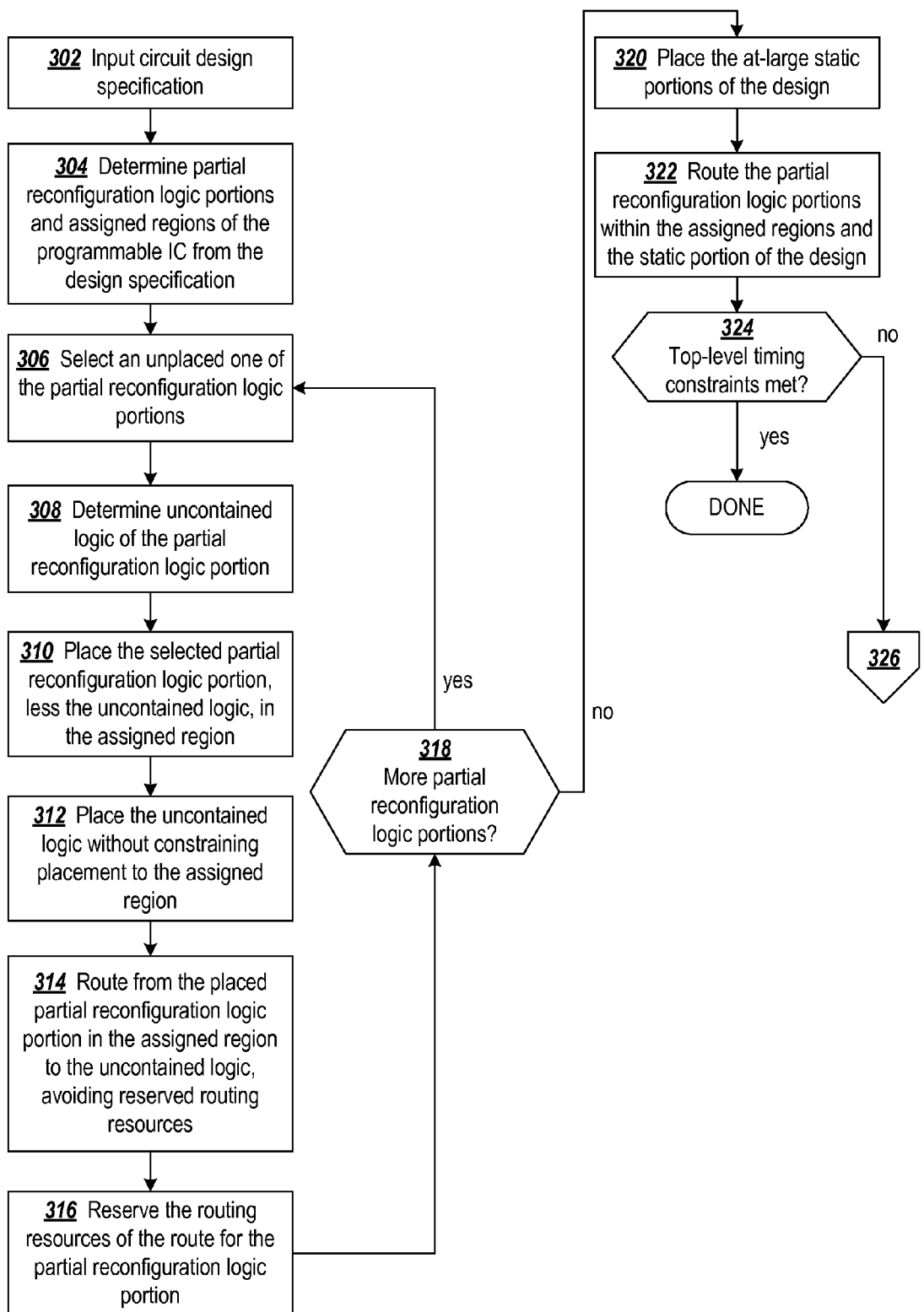
Figures 2, 3:
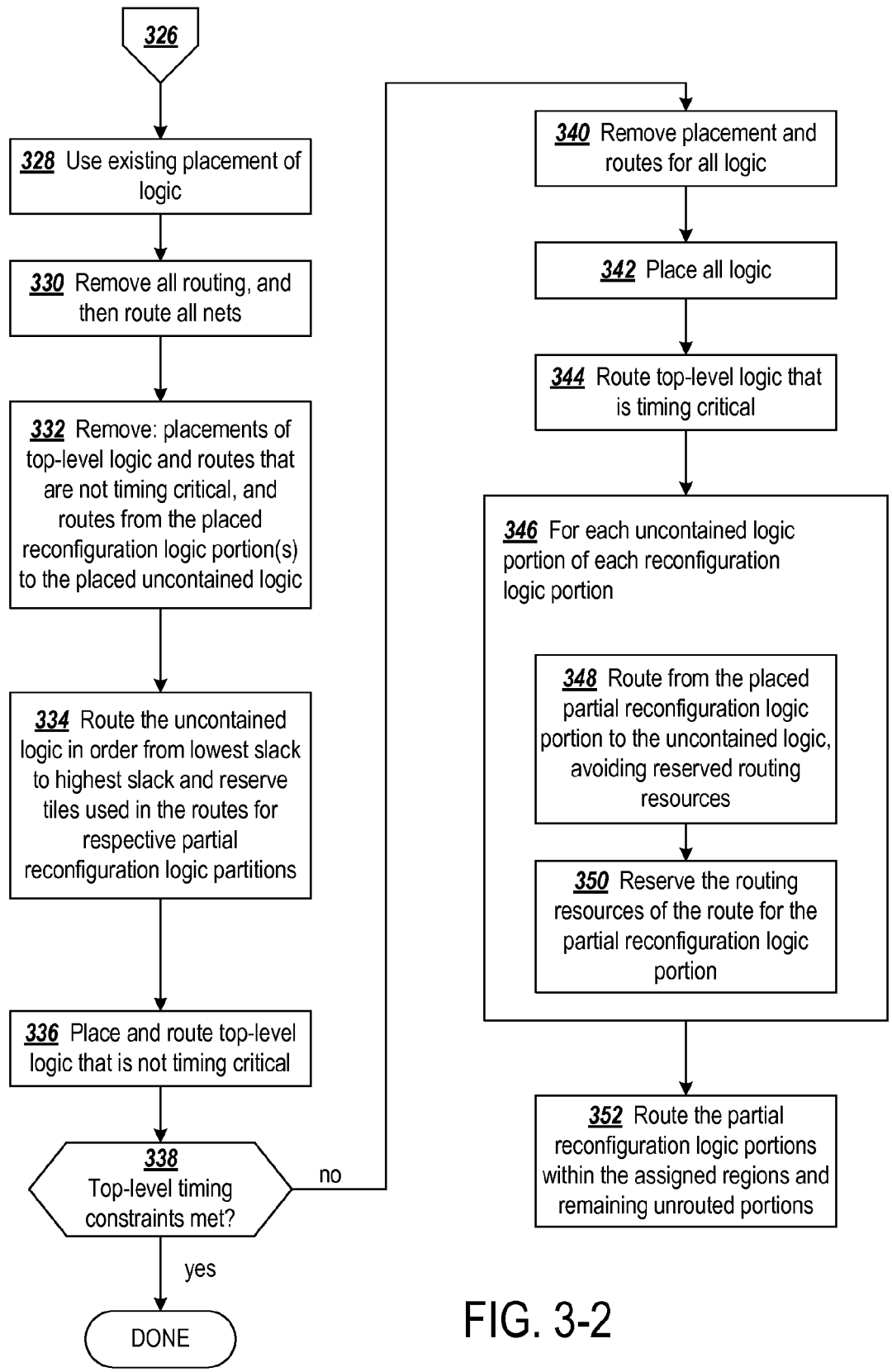

FIGS. 3-1 and 3-2 show a flowchart of an example process for placing and routing a circuit design in which the design is partitioned into partitions having PR logic and uncontained logic.

At block 302, the circuit design specification is input. The specification may be in the form of a netlist that is annotated to specify the PR logic portions of the circuit design. At block 304, the PR logic portions and the assigned regions are determined from the annotated netlist. Block 306 begins a loop in which each of the PR logic portions and any associated uncontained logic is individually placed and routed.

At block 306, the process selects an unplaced one of the PR logic portions, and at block 308, the process determines any uncontained logic used by the selected PR logic portion. The PR logic portion, less the identified uncontained logic, is placed in the assigned region at block 310. At block 312, the uncontained logic is placed on a resource of the target device, and the placement is unconstrained by the region assigned to the PR logic portion. That is, the uncontained logic may be placed within the assigned region or outside the assigned region, depending on the resource and availability.

At block 314, the process routes the placed PR logic portion to the uncontained logic, and routing resources that have been assigned to another PR logic portion are avoided. In some FPGAs, different segments of wires can be programmable connected by programmable interconnection points (PIPs). Cells in the configuration memory are programmable to interconnect the different segments of wire at each PIP. The configuration memory cells of the PIP are associated with a tile of the FPGA. Thus, once a PIP is used to route from a PR logic portion to uncontained logic outside the region of the PR logic portion, that PIP cannot be used by other PR logic portions of the design or by at-large static logic of the design. At block 314, the routing resources selected for routing from the PR logic portion to the uncontained logic are reserved for the PR logic portion. For any additional uncontained logic to be routed, the routing process attempts to use PIPs previously assigned to the PR logic portion in order to conserve on the use of PIP resources and leave other PIP resources available for other PR logic portions. At block 316, the process reserves for the PR logic portion the routing resource(s) used in routing from the PR logic portion to the uncontained logic.

The routing process of block 314 may avoid the routing resources of certain tiles in order to avoid unnecessarily reserving more resources than are needed. For example, in some FPGAs there are a limited number of DSPs and BRAMs. Only some of the tiles have DSPs and BRAMs. Thus, it is desirable during routing to avoid routing through a tile that has one of the scarce resources. Such tiles are excluded from eligibility for routing to the uncontained logic. A longer route may be employed to avoid reserving a tile with a scarce resource as long as timing constraints are satisfied.

At decision block 318, the process checks for additional PR logic portions to process. If there are any unplaced PR logic portions, the process returns to block 306. Otherwise, the process proceeds to block 320. At block 320, the at-large static logic is placed, and at block 322, the PR logic portions are routed internally. The at-large static logic is also routed. It will be recognized that in routing the at-large static logic the routing resources (e.g., PIPs) that have been assigned to PR logic portions are avoided.

Decision block 324 tests whether or not timing constraints are satisfied. If so, the process is complete. Otherwise, processing continues to block 328 in FIG. 3-2 via node 326.

Figures 1, 4:
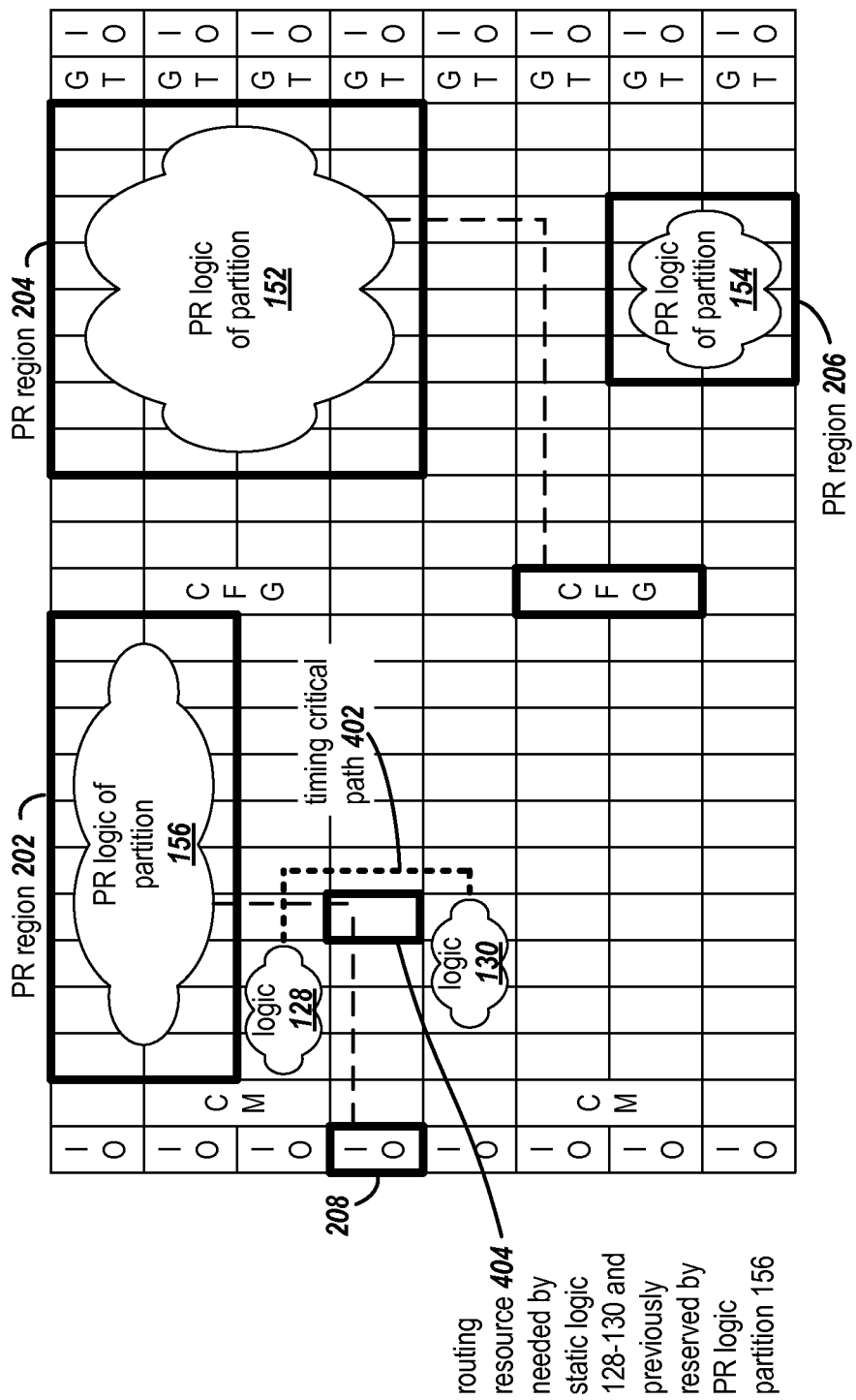
Figures 2, 4:
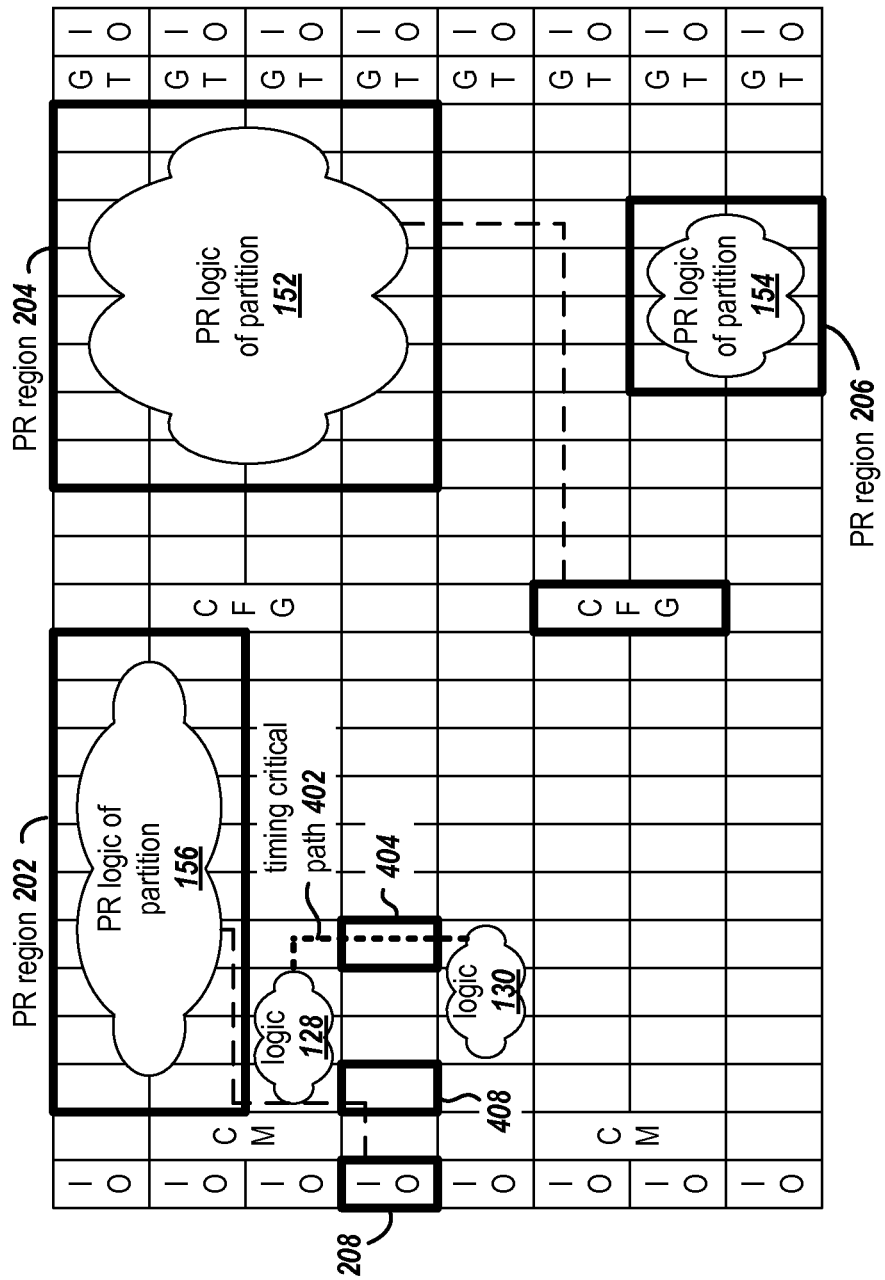

FIG. 4-1 shows the example of FIG. 2 in which the placed and routed at-large static logic fails to satisfy a timing constraint. The PR logic partition 156 and at-large static logic portions 128 and 130 contend for a routing resource of tile 404.

Logic portions 128 and 130 of the at-large static logic are placed and the route 402 is a timing critical path that fails to satisfy a timing constraint. The route from PR logic of partition 156 to the uncontained logic IO passes through a routing resource associated with tile 404. The PIP (not shown) associated with tile 404 is assigned to the PR logic partition 156.

Since the PR logic partition was routed to the uncontained logic before the at-large static logic was placed and routed, the routing resource of tile 404 needed by the at-large static logic was already assigned to the PR logic partition 156. The processing of FIG. 3-2 attempts to resolve timing issues through redoing placement and routing.

Returning now to FIG. 3-2, at block 328, the process begins with the placement from the processing of FIG. 3-1, which is the placement produced in FIG. 3-1. At block 330, the process removes all routing, and then proceeds to route all nets of the design. That is, the at-large static logic is routed along with connections between the PR logic partitions and the uncontained logic and connections within the PR logic partitions. After this routing, the routing from the PR logic partitions to the uncontained logic is redone since it may conflict with the routing resources used by the at-large static logic.

At block 332, the process removes the placements and routes of the at-large static logic that is not timing critical and also removes the routes from the PR logic portions to the uncontained logic. At block 334, the process routes the uncontained logic in order from the uncontained logic having the lowest slack to the uncontained logic having the highest slack. Rather than routing all the uncontained logic of a PR logic partition before proceeding to route the uncontained logic of another PR logic partition as in FIG. 3-1, block 334 routes in order of least slack to greatest slack without regard to the PR logic partition associated with the uncontained logic. The slack values may be determined from a delay estimator or may be the slack values generated in step 314 in the first attempt of routing to the uncontained logic. The tiles used in making the route are reserved for the PR logic partitions from which the uncontained logic is being routed.

At block 336, the process places and routes the at-large static logic (top-level logic) that is not timing critical. Decision block 338 tests whether or not the timing constraints have been met for the at-large static logic. If so, the process is complete. Otherwise, the process continues to block 340.

At block 340, the placement and routing is removed for all logic of the circuit design, and at block 342, all the logic is placed. The first routing is of the timing critical logic of the top-level logic at block 344.

Block 346 routes the PR logic portions to the uncontained logic. The processing of block 346 is repeated for each PR logic partition and the uncontained logic within each partition. The uncontained logic of a PR logic partition is routed at block 348. The routing of block 348 avoids routing resources of tiles assigned in the routing of block 344. Block 350 reserves routing resources for the PR logic partition being routed.

Once all the PR logic has been routed to the uncontained logic, the process proceeds to complete the remaining routing at block 352. At block 352, the logic within each PR logic partition is routed along with any un-routed portions of the at-large static logic.

FIG. 4-2 shows the modifications made to the placement and routing of FIG. 4-1 by the process of FIG. 3-2. The timing critical path 402 between logic 128 and logic 130 has been rerouted through the routing resources associated with tile 404. The route from PR logic partition 156 to the uncontained logic 208 is routed through the resources associated with tile 408.

FIG. 5 is a block diagram of an example programmable integrated circuit (IC) on which a circuit design may be placed and routed. The example programmable IC is an FPGA. FPGAs can include several different types of programmable logic blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507), for example, e.g., clock ports, and other programmable logic 508 such as digital clock managers, analog-to-digital converters, system monitoring logic, and so forth. Some FPGAs also include dedicated processor blocks (PROC 510) and internal and external reconfiguration ports (not shown).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
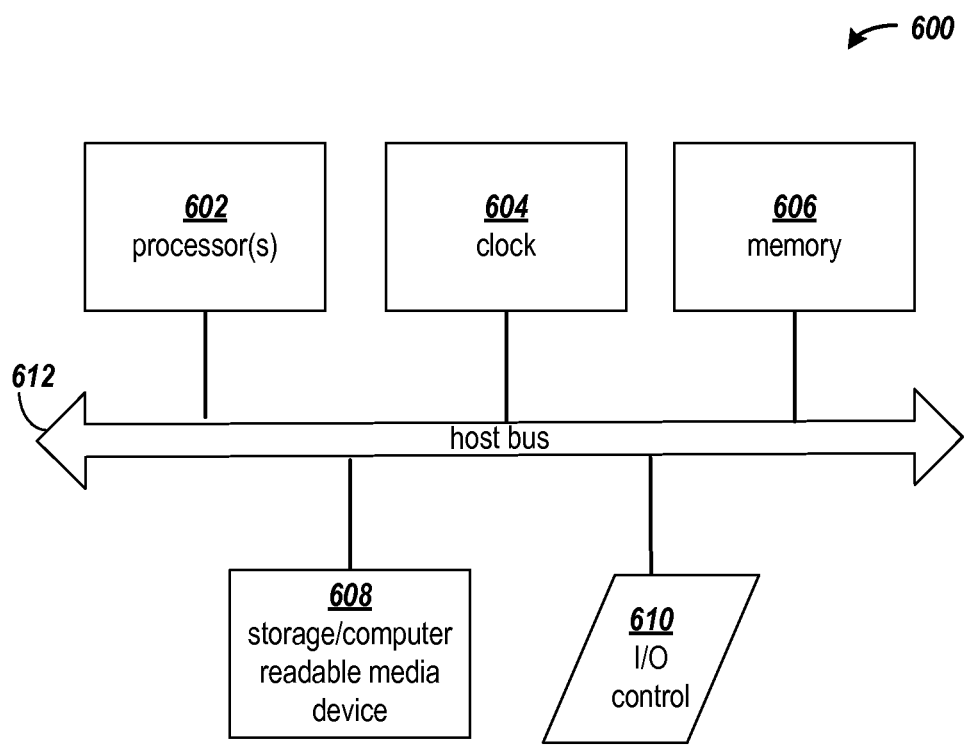
FIG. 6 shows a block diagram of an example computing arrangement that may be configured to implement one or more of the processes described herein.

FIG. 6 shows a block diagram of an example computing arrangement that may be configured to implement one or more of the processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 600 includes one or more processors 602, a clock signal generator 604, a memory unit 606, a storage unit 608, and an input/output control unit 610, all coupled to a host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory, and a main memory. The storage arrangement 608 may include local and/or remote persistent storage, such as provided by magnetic disks (not shown), flash, EPROM, or other non-volatile data storage. The storage unit may be read or read/write capable. Further, the memory 606 and storage 608 may be combined in a single arrangement.

The processor arrangement 602 executes the software in storage 608 and/or memory 606, reads data from and stores data to the storage 608 and/or memory 606, and communicates with external devices through the input/output control arrangement 610. These functions are synchronized by the clock signal generator 604. The resource of the computing arrangement may be managed by either an operating system (not shown), or a hardware control unit (not shown).

The embodiments are thought to be applicable to a variety of systems for partial configuration and partial reconfiguration of programmable integrated circuits. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of placing and routing a circuit design on a programmable integrated circuit (IC), comprising:
on one or more programmed processors, performing operations including:
selecting one partial reconfiguration (PR) resource portion of the circuit design from a plurality of PR resource portions of the circuit design, wherein each PR resource portion is assigned to a respective region of the programmable IC;
identifying uncontained resources in the selected PR resource portion;
placing the selected PR resource portion, less the uncontained resources, in the respective region;
placing the uncontained resources on the programmable IC unconstrained by the respective region;
routing from the selected PR resource portion placed in the respective region to the placed uncontained resources;
repeating the selecting, the identifying, the placing the selected PR resource portion, the placing the uncontained resources, and the routing for each unplaced PR resource portion; and
after placing the plurality of PR resource portions and routing to uncontained resources in the plurality of PR resource portions, placing and routing unplaced portions of the circuit design.

2. The method of claim 1, wherein:
the routing from the selected PR resource portion placed in the respective region to the placed uncontained resources includes reserving at least one resource of the programmable IC on a route from the selected PR resource portion to the placed uncontained resources; and
the placing and routing of the unplaced portions avoids placing and routing with the at least one resource.

3. The method of claim 1, further comprising, after the placing the plurality of PR resource portions and routing to the uncontained resources in the plurality of PR resource portions, routing resources within each of the plurality of PR resource portions.

4. The method of claim 1, wherein the routing from the selected PR resource portion placed in the respective region to the placed uncontained resource includes,
excluding one or more resources of the programmable IC from eligibility for the routing, wherein the one or more resources include a resource on which no logic has been placed and no route has been assigned.

5. The method of claim 4, wherein at least one of the one or more resources includes a digital signal processor (DSP).

6. The method of claim 4, wherein at least one of the one or more resources includes a block RAM (BRAM).

7. The method of claim 1, further comprising, after the placing and routing of the unplaced portions of the circuit design:
determining whether or not timing constraints are satisfied;
in response to determining that the timing constraints are not satisfied, performing operations including:
preserving a current placement;
removing all routing;
routing all nets of the circuit design after the removing;
after the routing all the nets, for top-level resources and routes that are not timing critical, removing placement and routing, and removing routes from the selected PR resource portion to the uncontained resources;
in an order from a net of the uncontained resources having a least amount of slack to a net of the uncontained resources having a greatest amount of slack, routing each net; and
after the routing each net in the order of the least amount of slack to the greatest amount of slack, placing and routing remaining unplaced portions of the circuit design.

8. The method of claim 7, further comprising, after the placing and routing remaining unplaced portions of the circuit design:
determining whether or not the timing constraints are satisfied;
in response to determining that the timing constraints are not satisfied, performing operations including:

removing all placement and routing;
placing all resources of the circuit design;
routing only portions of the circuit design that are timing critical;
after the routing only portions of the circuit design that are timing critical, routing from each PR resource portion to uncontained resources of the PR resource portion; and
after the routing from each PR resource portion to uncontained resources of the PR resource portion, routing remaining unrouted portions of the circuit design.

9. The method of claim 1, wherein the programmable IC is a field programmable gate array (FPGA), the FPGA includes an array of tiles, a plurality of the tiles include programmable logic, and a subset of the tiles include programmable interconnection points and a scarce resource, wherein the routing from the selected PR resource portion placed in the respective region to the placed uncontained resources includes,
excluding from consideration for routing from the selected PR resource portion to the placed uncontained resources a tile having a programmable interconnection point and a scarce resource.

10. The method of claim 1, wherein the uncontained resources are placed on an input/output block (IOB) of the programmable IC.

11. The method of claim 1, wherein the uncontained resources are placed on a gigabit transceiver (GT) of the programmable IC.

12. The method of claim 1, wherein the uncontained resources are placed on configuration logic of the programmable IC.

13. The method of claim 1, wherein the uncontained resources are placed on clock manager circuitry of the programmable IC.

14. A system for placing and routing a circuit design on a programmable integrated circuit (IC), comprising:
a processor; and
a memory arrangement coupled to the processor, wherein the memory arrangement is configured with instructions that are executable by the processor for causing the processor to perform the following operations:
selecting one partial reconfiguration (PR) resource portion of the circuit design from a plurality of PR resource portions of the circuit design, wherein each PR resource portion is assigned to a respective region of the programmable IC;
identifying uncontained resources in the selected PR resource portion;
placing the selected PR resource portion, less the uncontained resources, in the respective region;
placing the uncontained resources on the programmable IC unconstrained by the respective region;
routing from the selected PR resource portion placed in the respective region to the placed uncontained resources;
repeating the selecting, the identifying, the placing the selected PR resource portion, the placing the uncontained resources, and the routing for each unplaced PR resource portion; and
after placing the plurality of PR resource portions and routing to uncontained resources in the plurality of PR resource portions, placing and routing unplaced portions of the circuit design.

15. The system of claim 14, the operations further including:
wherein the routing from the selected PR resource portion placed in the respective region to the placed uncontained resources includes reserving at least one resource of the programmable IC on a route from the selected PR resource portion to the placed uncontained resources; and
the placing and routing of the unplaced portions avoids placing and routing with the at least one resource.

16. The system of claim 14, the operations further including, after the placing the plurality of PR resource portions and routing to uncontained resources in the plurality of PR resource portions, routing resources within each of the plurality of PR resource portions.

17. The system of claim 14, wherein the routing from the selected PR resource portion placed in the respective region to the placed uncontained resources includes,
excluding one or more resources of the programmable IC from eligibility for the routing, wherein the one or more resources include a resource on which no logic has been placed and no route has been assigned.

18. The system of claim 17, wherein at least one of the one or more resources includes a digital signal processor (DSP).

19. The system of claim 17, wherein at least one of the one or more resources includes a block RAM (BRAM).

20. The system of claim 14, wherein the programmable IC is a field programmable gate array (FPGA), the FPGA includes an array of tiles, a plurality of the tiles include programmable logic, and a subset of the tiles include programmable interconnection points and a scarce resource, wherein the routing from the selected PR resource portion placed in the respective region to the placed uncontained resources includes,
excluding from consideration for routing from the selected PR resource portion to the placed uncontained resources a tile having a programmable interconnection point and a scarce resource.

* * * * *